United States Patent [19]

Shalek et al.

[11] Patent Number: 4,789,537
[45] Date of Patent: Dec. 6, 1988

[54] PREALLOYED CATALYST FOR GROWING SILICON CARBIDE WHISKERS

[75] Inventors: Peter D. Shalek, Los Alamos, N. Mex.; Joel D. Katz, Niagara Falls, N.Y.; George F. Hurley, Los Alamos, N. Mex.

[73] Assignee: The United States of America as represented by the United States Department of Energy, Washington, D.C.

[21] Appl. No.: 68,796

[22] Filed: Jun. 25, 1987

Related U.S. Application Data

[63] Continuation of Ser. No. 814,866, Dec. 30, 1985, abandoned.

[51] Int. Cl.⁴ .............................................. C01B 31/36
[52] U.S. Cl. ..................................... 423/346; 423/345
[58] Field of Search ................................. 423/346, 345

[56] References Cited

U.S. PATENT DOCUMENTS

| | | | |
|---|---|---|---|
| 3,011,912 | 12/1916 | Gareis et al. | 428/428 |
| 3,053,635 | 9/1962 | Shockley | 156/620.3 |
| 3,161,473 | 12/1964 | Pultz | 423/345 |
| 3,230,053 | 1/1966 | Wakelyn et al. | 422/199 |
| 3,236,780 | 2/1966 | Ozarow | 252/301.4 R |
| 3,246,950 | 4/1966 | Gruber | 423/346 |
| 3,275,415 | 2/1964 | Chang et al. | 437/100 |
| 3,306,705 | 2/1967 | Leineweber et al. | 423/346 |
| 3,346,414 | 10/1967 | Ellis et al. | 156/609 |
| 3,382,113 | 5/1968 | Ebert et al. | 156/606 |
| 3,391,681 | 7/1968 | Westdorp | 156/609 |
| 3,493,431 | 2/1970 | Wagner | 156/609 |
| 3,520,740 | 7/1970 | Addamiano | 156/612 |
| 3,546,032 | 12/1970 | Basart et al. | 437/100 |
| 3,622,272 | 11/1971 | Shyne et al. | 423/346 |
| 3,653,851 | 4/1972 | Gruber | 428/539.5 |
| 3,721,732 | 3/1973 | Knippenberg et al. | 423/346 |
| 3,813,340 | 5/1974 | Knippenberg et al. | 252/62.3 C |
| 3,933,984 | 1/1976 | Kimura et al. | 423/345 |
| 4,013,503 | 3/1977 | Knippenberg et al. | 423/346 |
| 4,100,233 | 7/1978 | Yajima et al. | 423/345 |
| 4,349,407 | 9/1982 | Lundberg | 156/624 |
| 4,500,504 | 2/1985 | Yamamoto | 423/345 |
| 4,504,453 | 3/1985 | Tanaka et al. | 423/345 |
| 4,513,030 | 4/1985 | Milewski | 427/227 |

FOREIGN PATENT DOCUMENTS

| | | |
|---|---|---|
| 608032 | 11/1960 | Canada . |
| 922485 | 3/1973 | Canada . |
| 2042584 | 3/1971 | Fed. Rep. of Germany . |
| 2042813 | 4/1971 | Fed. Rep. of Germany . |
| 2529584 | 1/1984 | France ............................ 423/345 |
| 50-115197 | 9/1975 | Japan . |
| 1280506 | 7/1972 | United Kingdom . |
| 1280648 | 7/1972 | United Kingdom . |

OTHER PUBLICATIONS

Hurley et al., Silicon Carbide Whiskers and Ceramic Composites, Materials Science and Technology, 1986 Review.

Kenneth M. Merz, "Crystal, Whisker and Microcrystalline Forms of Silicon Carbide," in Silicon Carbide A High Temperature Semiconductor, Proceedings of the Conference on Silicon Carbide, Boston, Mass., Apr. 2-3, 1959, (Pergamon Press, New York, 1960), pp. 73-83.

F. A. Halden, "Growth of Silicon Carbide Crystals from Solution in Molten Metal Alloys," in Silicon Carbide A High Temperature Semiconductor, Proceedings of the Conference on Silicon Carbide, Boston, Mass., Apr. 2-3, 1959, (Pergamon Press, New York, 1960), pp. 115-123.

(List continued on next page.)

Primary Examiner—John Doll
Assistant Examiner—Lori S. Freeman
Attorney, Agent, or Firm—Richard J. Cordovano; Paul D. Gaetjens; Judson R. Hightower

[57] ABSTRACT

A prealloyed metal catalyst is used to grow silicon carbide whiskers, especially in the β form. Pretreating the metal particles to increase the weight percentages of carbon or silicon or both carbon and silicon allows whisker growth to begin immediately upon reaching growth temperature.

4 Claims, 2 Drawing Sheets

OTHER PUBLICATIONS

Lyle Patrick et al., "Growth, Luminescence, Selection Rules, and Lattice Sums of SiC with Wurtzite Structure," Phys. Rev., 143, No. 2, 526–536, (1966).

I. Berman and C. E. Ryan, "The Growth of Silicon Carbide Needles by the Vapor-Liquid-Solid Method," J. Cryst. Growth, 9, 314–318, (1971).

G. A. Bootsma, W. F. Knippenberg and G. Verspui, "Growth of SiC Whiskers in the Systems $SiO_2$—C—$H_2$ Nucleated by Iron," J. Cryst. Growth, 11, 297–309, (1971).

Yu. M. Tairov, V. F. Tsvetkov and I. I. Khlebnikov, "Growth of Silicon Carbide Crystals by Vapour-Liquid-Solid (VLS) Mechanism in the Sublimation Method," J. Cryst. Growth, 20, 155–157, (1973).

Harry S. Katz et al., Handbook of Fillers and Reinforcements for Plastics, (Van Nostrand Reinhold Co., New York, 1978), pp. 448–450, 464.

"Marcowhisker," Sci. Am., 64, (1985).

John V. Milewski et al., "Growth of Beta-Silicon Carbide Whiskers by the VLS Process," J. Materials Science, 20, 1160–1166, (1985).

PREALLOYED CATALYST FOR GROWING SILICON CARBIDE WHISKERS

This is a continuation of application Ser. No. 874,866 filed Dec. 30, 1985 now abandoned.

BACKGROUND OF THE INVENTION

The present invention relates generally to a prealloyed catalyst and the use of such a catalyst in manufacturing silicon carbide whiskers. More particularly, the present invention relates to a prealloyed catalyst containing a sufficiently high percentage of carbon, silicon, or carbon and silicon to allow growth of silicon carbide whiskers to commence immediately upon reaching the growth temperature. This invention is the result of a contract with the Department of Energy (Contract No. W-7405-ENG-36).

Silicon carbide whiskers are valued for their needle-like single crystal structure which leads to such excellent properties as high strength, high elastic modulus, heat resistance, chemical stability, and so on. The whiskers have been used as a composite reinforcing material for metals, plastics, and ceramics. The most desirable whiskers are β silicon carbide single crystals which have a high length to diameter ratio.

Various methods of using a catalyst to promote the growth of silicon carbide whiskers have been proposed. In U.S. Pat. No. 4,500,504 issued to Yamamoto, a silica gel with 6 to 25% by weight metal catalyst was mixed with furnace carbon black. The mixture then was placed in a non-oxidative atmosphere at a temperature of 1300° to 1700° C. to produce silicon carbide whiskers. The metal catalyst was selected from the group of iron, nickel, and cobalt. However, the metal was used as is, i.e., with no pretreatment. In U.S. Pat. No. 3,622,272 issued to Shyne et al., the use of powdered metals such as iron, manganese, nickel, aluminum, and stainless steel was disclosed for its role as a surface nucleation site. The powdered metal coatings were applied to a substrate such as graphite for the growing of silicon carbide whiskers. The only pretreatment disclosed for the metal powders was to suspend them in a liquid carrier vehicle such that the metal powders could be applied to the surface of the growth substrate.

In the article "Growth of SiC Whiskers in the System $SiO_2$—C—$H_2$ Nucleated by Iron," authored by J. A. Bootsma et al., which appeared in J. Cryst. Growth 11, 297-309 (1971), the nucleation phenomenon of growing silicon carbide whiskers using iron particles as nucleating agents was studied. It was found that the iron particles first took up silicon and carbon from the vapor when the furnace temperature reached 1200° C. After sufficient uptake, an Fe—Si—C alloy droplet was obtained from which the silicon carbide whisker grew. However, again there was no suggestion of pretreating the iron particle before the furnace was heated up toward nucleation temperature.

U.S. Pat. No. 3,721,732 issued to Knippenberg et al. on Mar. 20, 1973, contained contradictory advice concerning the addition of silicon to iron catalyst particles. In claim 4 as well as while discussing cubic growth, the patent speculated that admixing silicon to iron may facilitate cubic crystal growth. However, earlier in the patent text, it was stated that iron may without objection contain carbon and silicon or other elements, but improvement in the growth of crystals, as a result, had not been found. At best, this patent left doubt about whether silicon addition to iron catalyst particles would help in the overall growth of the silicon carbide whiskers. The role of specially treated catalyst particles in prompt initiation of nucleation at catalyst sites was not commented upon in this patent.

Overall, a need still existed for a method to avoid the delay in the growth of silicon carbide whiskers after reaching the growth temperature while the melted catalyst takes up from the surrounding furnace atmosphere the necessary percentages of carbon and silicon to initiate growth. When the catalyst particles were placed upon a carbon substrate, the particle interacted with the substrate in order to absorb carbon, which along with the accretion of silicon from the vapor results in an incubation time before growth can be initiated.

SUMMARY OF THE INVENTION

The object of this invention is to provide a catalyst and a method of using the catalyst to manufacture silicon carbide whiskers which yield whiskers with a desirable length to diameter ratio.

A further object of the present invention is to provide a catalyst and a method for using the catalyst to manufacture silicon carbide whiskers where whisker growth can immediately commence upon reaching the growth temperature.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the method of this invention may comprise a method for manufacturing silicon carbide whiskers comprising: a. prealloying a metallic catalyst with carbon, silicon, or a mixture of carbon and silicon; b. applying said prealloyed catalyst to a carbon substrate; c. heating said substrate with applied prealloyed catalyst in a reducing atmosphere; d. introducing silicon and carbon containing gases into said atmosphere; e. maintaining the flow of said silicon containing gas while the temperature of said substrate is maintained at a temperature sufficient to induce growth of silicon carbide whiskers; and f. cooling said silicon carbide whiskers after completion of whisker growth.

The present invention may also comprise, in accordance with its objects and purposes, a catalyst for producing silicon carbide whiskers on a carbon substrate comprising a metal prealloyed with carbon and silicon before heating to the silicon carbide whisker growth temperature.

An advantage of the present invention is the manufacturing of silicon carbide whiskers in the β form with adequate diameters to give desirable properties.

Yet another advantage of the present invention is the rapid initiation of growth of silicon carbide whiskers when the furnace atmosphere reaches the growth temperature.

BRIEF DESCRIPTION OF THE DRAWINGS

The accompanying drawings, which are photomicrographs and are incorporated in and form a part of the specification, illustrate the embodiments of the present invention and, together with the description, serve to explain the principles of the invention. In the drawings.

DETAILED DESCRIPTION OF THE PREFERRED EMBODIMENTS

Figure 1:
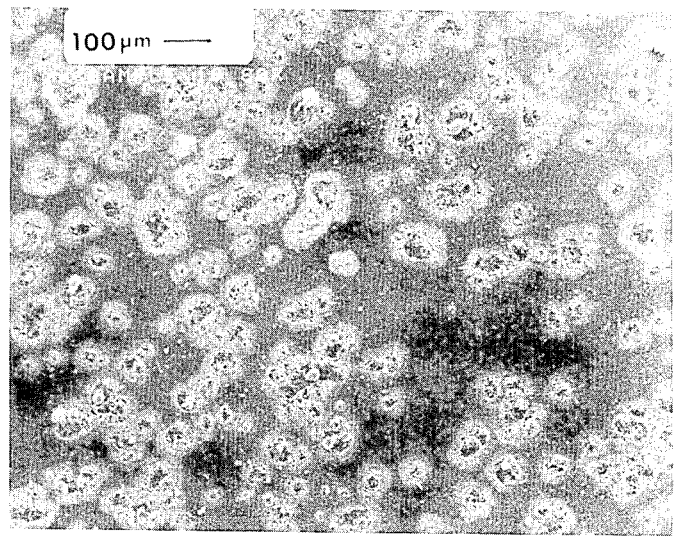
FIG. 1 is a photomicrograph at 80 times magnification for growth from a ferrosilicon catalyst growth wherein the ferrosilicon has not been carburized.

Untreated catalyst particles are available from many sources. For instance, stainless steel flakes are available from Novamet in Wykoff, N.J. Catalyst particles composed of a substance designated as Alloy 62 which has the following weight percent composition: Mn 65, Co 14, Ni 20, si 0.25, Fe 0.1, Cr 0.2, B 0.25, Zn 0.25, are available from Metallurgical Technology in Winslow, N.J. Other catalysts such as ferrosilicon are commonly available from many sources. Before treatment the catalyst particles are sieved for size such that, as nearly as possible, no spherical particle is larger than 15 $\mu$m or smaller than 10 $\mu$m; or no flake particle upon melting would yield a sphere larger than 15 $\mu$m or smaller than 10 $\mu$m.

Various methods for pretreating the catalyst particles to increase the percentage of carbon or silicon or both are available. Silicon may be added by melting the catalyst particles and adding solid silicon to the melt. The prealloyed substance is then pulverized into a desired size. Carbon may be added by this melting method also. Carbon may also be added by carburizing the catalyst particles before they are placed in the silicon carbide whisker growth furnace. An additional method for carburizing the catalyst particles is to allow a carbon rich gas to flow over the untreated catalyst particles applied to growth surfaces in the furnace at a temperature below the growth temperature for silicon carbide whiskers. A colloidal carbon, such as dgf 123 ® produced by Miracle Power Products Co. of Cleveland, Ohio, can be sprayed over the catalyst before or after applying to the growth substrate which is put in the furnace. Finally, a catalyst particle may be made from a mixture of elements chosen to resemble the weight percentage composition of various elements found in the catalyst ball present at the end of the silicon carbide whisker.

The percentage of silicon or carbon or both silicon and carbon to be added to catalyst particles varies over a wide range. The catalyst can be composed of from 1 to about 45 weight percent silicon. The prealloyed catalyst can also contain from 0.1 to 5.0 weight percent carbon. The metals which may serve as catalyst particles include one or more of the following metals: manganese, iron, nickel, cobalt, chromium, and niobium. One typical composition of a prealloyed catalyst is the following: 1.6 weight percent manganese, 23.4 weight percent cobalt, 22.9 weight percent nickel, 40.9 weight percent silicon, 10.2 weight percent iron, and 1 weight percent chromium. This particular composition represents the element weight percentages found in a catalyst ball in the end of the silicon carbide whisker after growth was initated with an untreated Alloy 62 catalyst particle.

The catalyst after the prealloying treatment, is then deposited upon the growth substrate. Most often this growth substrate is graphite. The two most common methods for depositing the catalyst particles upon the substrate are painting and spraying. For both methods it is necessary to suspend the catalyst particles in some type of solution. For painting, i.e., applying the catalyst particle suspension with a brush, a typical suspension vehicle is made of a weight of Cabosil ®, which is a product of the Cabot Corporation, Boston, Mass., equal to 4.5 parts by weight of catalyst particles which is then further mixed with 50 parts each of a liquid acrylic resin and methyl ethyl ketone. Catalyst particles can also be suspended in a product of Micromeritics, Inc., of Atlanta, Ga. called 14A Sedisperse ® (approximate composition: 0.1% phosphatidyl choline, 0.1% phosphatidyl ethanolamine, 0.1% inositol phosphatides, 1.7% isopropyl myristate blended with alkyl polyoxyethylene ethanols, and 98% base liquid.)

Once the growth plates have been coated with catalyst particles, they are placed in the growth zone of a furnace. The plates were typically graphite of 6 in. by 13 in. dimensions. The furnace can be a heated by SiC resistance elements, and use a quartz muffle to contain the growth plates. Such furnaces allow the silicon carbide whisker growth to occur under a reducing atmosphere which is typically a hydrogen atmosphere. The furnace also allows for a flow of various gases through the growth zone. Typically these gases are SiO, $SiCl_4$, $SiCH_3Cl_3$, or silane. The growth temperature can be anywhere from 1200° to 1600° C., but preferably are 1350° to 1430° C. After placing the coated growth substrates into the furnace, it is necessary to heat the furnace up. Typically the growth period lasts for eight hours. After reducing the temperature setting to 1000° C., the growth plates are removed and cooled to room temperature. Then the silicon carbide whiskers are harvested by careful scraping.

EXAMPLE 1

Figure 2:
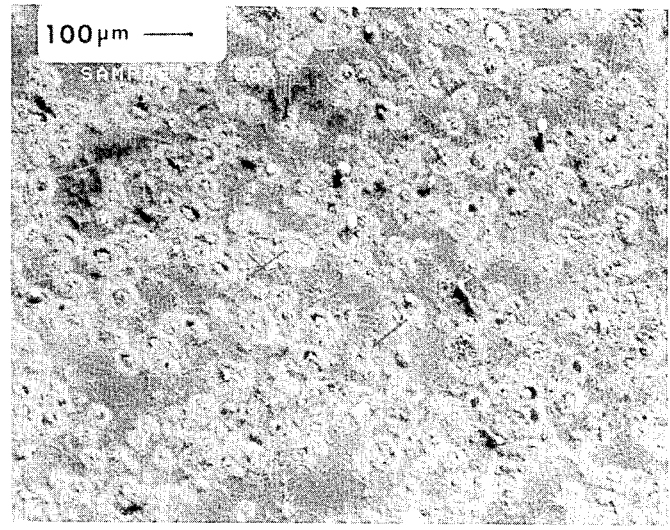
FIG. 2 is a photomicrograph at 80 times magnification wherein a ferrosilicon catalyst particle has been carburized.

FIGS. 1 and 2 were produced by placing ferrosilicon catalyst particles on a solid carbon substrate in a Centorr Model 10-2.5×8 furnace. This electrically heated furnace was supplied with electrical power controlled by a Helmar Model TA-1 power controller and used a 60 hertz current of 1000 amps at 10 volts during the heat up time. The growth zone inside the furnace was monitored for temperature by means of thermocouples. The furnace allowed gases to flow through it during both heat up and growth periods. The predominant gas flowing through the furnace during both heat up and growth periods, after an argon purge, was hydrogen, a reducing gas. FIG. 1 shows the result of heating ferrosilicon catalyst particles on a carbon substrate where the temperature was promptly lowered after reaching growth temperature. FIG. 1 also shows the result of not prealloying the catalyst particles with carbon. The flow gases used during the heat up period did not contain a methane or other carbon containing component which would allow the catalyst particles during the heat up period to carburize.

| TIME | TEMPERATURE IN °C. | |
|---|---|---|
| 1:35 | | power on |

-continued

| TIME | TEMPERATURE IN °C. | |
|---|---|---|
| 1:45 | 200 | |
| 1:58 | 1100 | |
| 2:04 | 1340 | |
| 2:07 | 1400 | |
| 2:08:30 | 1403 | temperature stabilized |
| 2:09 | | gas on |
| 2:10 | 1405 | |
| 2:11:00 | 1404 | |
| 2:12;00 | 1402 | |
| 2:13:30 | 1400 | |
| 2:15:00 | 1396 | |
| 2:18:00 | 1390 | |
| 2:19:00 | 1389 | gas off |
| 2:19:10 | | power decreased to 1.5 |
| 2:38:00 | 1129 | |

FIGS. 1 and 2 are photomicrographs taken at 80 times magnification. FIG. 2 is the result of using ferrosilicon catalyst particles on a solid carbon substrate, only this time the gas flow was initiated at a lower temperature and included a methane component. This methane component carburized the catalyst particles before they reached the growth temperature. The following table shows the heating schedule:

| TIME | TEMPERATURE IN °C. | |
|---|---|---|
| 2:40 | | power on - setting 2.0 |
| | | argon purge |
| 2:49 | 150 | power increase to 3.0 |
| 2:54 | 450 | |
| 2:56 | 600 | gas on |
| 3:09:35 | 1340 | power decreased to 2.18 |
| 3:11 | 1349 | |
| 3:12 | 1393 | |
| 3:12:45 | 1400 | power decreased to 1.5 |
| 3:18 | 1338 | |
| 3:27 | 1187 | gas off argon on |

As can be seen from the figures, when the processed gas was introduced at a lower temperature and included a carbon component, the growth of silicon carbide whiskers was greater than when there was no carburization of the ferrosilicon catalyst particles. FIG. 2 shows evidence of the growth of whiskers with the catalyst balls intact at the end of the whiskers when the growth period was terminated.

EXAMPLE 2

Figure 3:
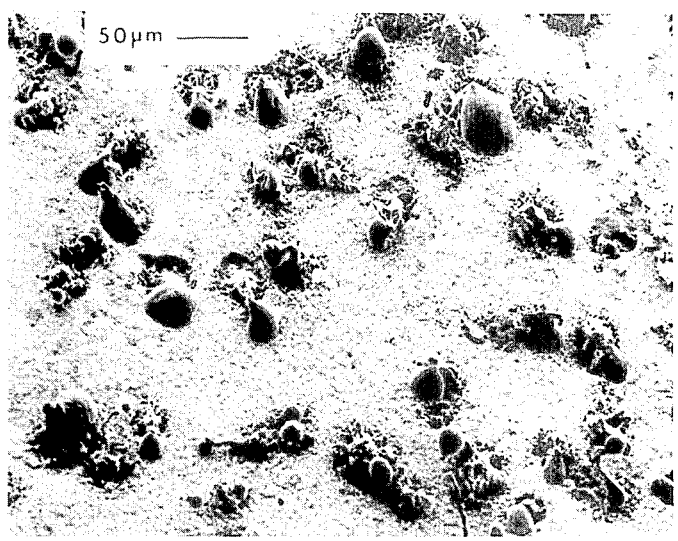
FIG. 3 is a photomicrograph at 240 times magnification where Alloy 62 catalyst particles have not been diluted with silicon.

The same furnace and procedures as used in Example 1 were used in Example 2. FIG. 3 shows a photomicrograph at 240 times magnification of Alloy 62 catalyst particles after ten minutes at growth temperature, 1413° C. The catalyst was composed of the following weight percents: 66% Mn, 16% Ni, 16% Co, 0.8% B, and 1.2% trace elements. The heating schedule was as follows:

| TIME | TEMPERATURE IN °C. | |
|---|---|---|
| 2:30 | | Power on |
| 2:50 | 1045 | |
| | | argon purge |
| 3:01 | 1402 | power backed off to 2.2 |
| 3:03 | 1409 | gas on |
| 3:05 | 1413 | power backed off to 2.18 |
| 3:08 | 1414 | |
| 3:10 | 1413 | |
| 3:13 | 1412 | gas off - power backed off |

| TIME | TEMPERATURE IN °C. | |
|---|---|---|
| | | to 1.5 |

As can be seen from FIG. 3, the photomicrograph, there was little nucleation at the catalyst particle sites and there was little growth of the silicon carbide whiskers where there had been any nucleation.

Figure 4:
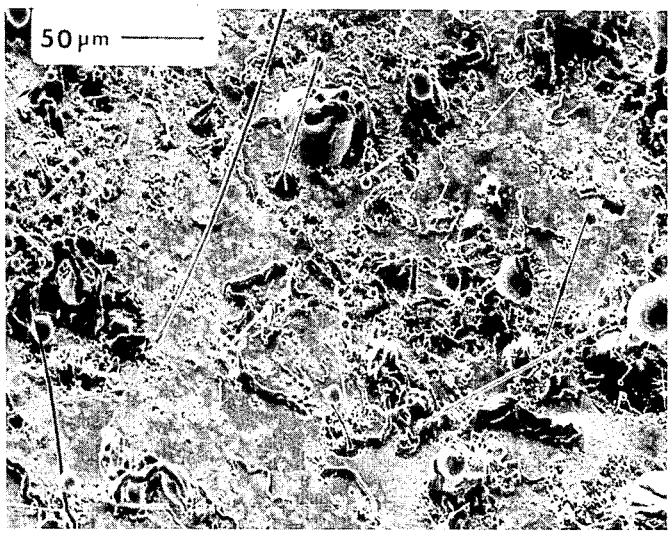
FIG. 4 is a photomicrograph at 240 times magnification wherein Alloy 62 catalyst particles have been diluted with silicon.

FIG. 4 shows a photomicrograph at 240 times magnification for Alloy 62 particles to which a substantial percentage of silicon has been added. The composition of the catalyst particles was as follows in weight percent: 25% Si, 50.0% Mn, 12.2% Ni, 12.2% Co, and 0.6% B. Again carbon substrate plates coated with catalyst particles were placed in the same furnace as in Example 1. The heating schedule was as follows:

| TIME | TEMPERATURE IN °C. | |
|---|---|---|
| 9:56 | | power on - setting 3 |
| | | argon purge |
| 10:04 | 700 | |
| 10:08 | 1000 | |
| 10:17 | 1350 | power backed off to 2.18 |
| 10:19 | 1400 | |
| 10:19:45 | 1408 | |
| 10:20:30 | 1414 | |
| 10:21 | 1416 | |
| 10:22 | 1420 | |
| 10:23 | | gas on |
| 10:24 | 1426 | |
| 10:25 | 1428 | |
| 10:27 | 1430 | |
| 10:33 | 1430 | |
| 10:34 | | gas off |
| | | flow off |
| 10:34:30 | | power decreased to 1.5 |
| 10:45:30 | 1245 | |

The difference between FIG. 3 and FIG. 4 is striking. FIG. 3, which represents Alloy 62 without the addition of silicon after ten minutes at growth temperature, shows little whisker growth with just a few whiskers and catalyst balls at their ends present. In contrast, FIG. 4, which represents Alloy 62 with silicon added, after ten minutes at growth temperature shows significant whisker development with the associated catalyst balls at the end of the whiskers that had nucleated at catalyst particle sites.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for manufacturing silicon carbide whiskers wherein manufacturing time is reduced comprising:

a. providing a growth substrate having a coating comprised of metallic catalyst particles alloyed with silicon, where the particles contain from about 1 to about 45 weight % silicon;

b. heating the coated growth substrate in a gaseous environment comprised of a reducing gas;

c. adding to the gaseous environment a gas comprised of silicon and a gas comprised of carbon;

d. maintaining for a time period the coated growth substrate and gaseous environment at a temperature above a minimum temperature at which silicon carbide whiskers will form, where said minimum temperature is from about 1200° to about 1600° C.; and e. removing the gas comprised of silicon and the gas comprised of carbon from the gaseous environment, cooling the coated growth substrate, and recovering silicon carbide whiskers from the coated growth substrate.

2. The method of claim 1 wherein the reducing gas is hydrogen.

3. The method of claim 1 wherein the gas comprised of silicon is a gas chosen from a group containing SiO, $SiCl_4$, $SiCH_3Cl_3$, and silane.

4. The method of claim 1 wherein the gas comprised of carbon is methane.

* * * * *